(12) United States Patent
Kim

(10) Patent No.: US 9,871,509 B2
(45) Date of Patent: Jan. 16, 2018

(54) POWER-ON RESET CIRCUIT

(71) Applicant: Murata Manufacturing Co., Ltd., Kyoto (JP)

(72) Inventor: Ryangsu Kim, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 153 days.

(21) Appl. No.: 14/569,897

(22) Filed: Dec. 15, 2014

(65) Prior Publication Data
US 2015/0200653 A1 Jul. 16, 2015

(30) Foreign Application Priority Data
Jan. 16, 2014 (JP) ................................. 2014-005822

(51) Int. Cl.
| | |
|---|---|
| H03K 17/22 | (2006.01) |
| H03K 3/037 | (2006.01) |
| H03K 3/012 | (2006.01) |
| G06F 1/24 | (2006.01) |

(52) U.S. Cl.
CPC ............ *H03K 17/223* (2013.01); *G06F 1/24* (2013.01); *H03K 3/012* (2013.01); *H03K 3/0375* (2013.01); *H03K 17/22* (2013.01)

(58) Field of Classification Search
None
See application file for complete search history.

(56) References Cited

U.S. PATENT DOCUMENTS

| | | | | | |
|---|---|---|---|---|---|
| 4,727,309 | A | * | 2/1988 | Vajdic | G05F 3/247 323/312 |
| 5,166,546 | A | * | 11/1992 | Savignac | H03K 17/223 327/143 |
| 5,841,309 | A | * | 11/1998 | Bonaccio | H03K 19/018521 326/34 |
| 5,930,129 | A | * | 7/1999 | Sugimura | H03K 17/223 323/265 |
| 6,025,748 | A | | 2/2000 | Murakami | |

(Continued)

FOREIGN PATENT DOCUMENTS

| | | |
|---|---|---|
| JP | H10-255464 A | 9/1998 |
| JP | 2003-008426 A | 1/2003 |

(Continued)

OTHER PUBLICATIONS

Notice of Reason for Rejection issued in corresponding Japanese Patent Application No. 2014-005822 dated Dec. 1, 2015.

*Primary Examiner* — Tuan L Lam
(74) *Attorney, Agent, or Firm* — Pearne & Gordon LLP

(57) ABSTRACT

A power-on reset circuit includes a first resistor having one end connected to a power source node; a first capacitor connected to another end of the first resistor; a second resistor having one end connected to the power source node; a second capacitor connected to another end of the second resistor; a first inverter having a power source terminal connected to the other end of the first resistor and an input terminal connected to the other end of the second resistor; and a second inverter having a power source terminal connected to the other end of the first resistor, an input terminal connected to an output terminal of the first inverter, and an output terminal electrically connected to a reset signal output terminal.

2 Claims, 8 Drawing Sheets

(56) References Cited

U.S. PATENT DOCUMENTS

| | | | | |
|---|---|---|---|---|
| 6,603,338 B1* | 8/2003 | McClure | .................. | G11C 8/06 |
| | | | | 327/172 |
| 6,731,143 B2* | 5/2004 | Kim | ..................... | H03K 17/223 |
| | | | | 327/143 |
| 7,830,181 B1* | 11/2010 | Huang | ................. | H03K 5/1252 |
| | | | | 327/34 |
| 8,149,029 B2* | 4/2012 | Wang | ..................... | G11B 7/126 |
| | | | | 327/143 |
| 2004/0012418 A1 | 1/2004 | Kim | | |
| 2006/0082396 A1* | 4/2006 | Steinacker | ....... | H03K 3/356008 |
| | | | | 327/78 |
| 2010/0060330 A1* | 3/2010 | Chen | ................... | H03K 17/223 |
| | | | | 327/143 |
| 2010/0078488 A1* | 4/2010 | Nagatsuka | ......... | G06K 19/0723 |
| | | | | 235/492 |
| 2012/0126864 A1* | 5/2012 | Daigle | ................. | H03K 17/223 |
| | | | | 327/143 |
| 2016/0028349 A1* | 1/2016 | Rajavi | ..................... | H03B 5/36 |
| | | | | 331/116 FE |

FOREIGN PATENT DOCUMENTS

| | | | |
|---|---|---|---|
| JP | 2007-306351 | A | 11/2007 |
| JP | 2008-310718 | A | 12/2008 |
| JP | 2011-114754 | A | 6/2011 |
| JP | 4910250 | B2 | 4/2012 |

\* cited by examiner

POWER-ON RESET CIRCUIT

BACKGROUND OF THE INVENTION

1. Field of the Invention

The present invention relates to power-on reset circuits.

2. Description of the Related Art

Reset terminals are provided in digital integrated circuits (also called simply "ICs" hereinafter). Low-level and high-level reset signals (voltages) are supplied to a reset terminal.

An IC operates while a high-level voltage is being supplied to the reset terminal, for example. The IC is reset when a low-level voltage is supplied to the reset terminal. The IC remains in a reset state while the low-level voltage is being supplied to the reset terminal.

Whether a low-level or high-level voltage is supplied to the reset terminal is determined based on, for example, a power source voltage of the IC. It is possible that the IC will not operate normally in the case where the power source voltage is low. Accordingly, it is preferable to supply the low-level reset signal to the reset terminal and keep the IC in a reset state. However, in the case where the power source voltage is not low, it is preferable to supply the high-level reset signal and cause the IC to operate. Note that it is preferable to reset the IC using the reset signal when the supply of the power source voltage starts and the IC begins to operate.

A power-on reset circuit is known as a circuit for supplying a reset signal to a reset terminal based on a power source voltage. For example, Japanese Unexamined Patent Application Publication No. 2003-8426 discloses a power-on reset circuit that generates a reset signal when a power source voltage is applied and resets a flip-flop circuit provided in the IC using the reset signal. This type of power-on reset circuit includes active elements such as inverters and the like.

The power-on reset circuit requires the power source voltage in order to operate the active elements such as inverters. A configuration in which the same voltage source is used as a voltage source for supplying a power source voltage to the power-on reset circuit and a voltage source for supplying the power source voltage to the IC can be considered as one way of reducing the size, cost, and so on of the device as a whole. Japanese Unexamined Patent Application Publication No. 2003-8426, however, does not teach such a configuration.

In the case where the same voltage source is used as the voltage source for the power-on reset circuit and the voltage source for the IC, if the voltage of the voltage source (the power source voltage) drops, the voltage required to operate the inverter in the power-on reset circuit, for example, cannot be obtained. There is thus a risk that the power-on reset circuit will no longer operate normally.

BRIEF SUMMARY OF THE INVENTION

It is an object of the present invention to enable a power-on reset circuit to operate in a stable manner even in the case where the same voltage source is used as a voltage source for the power-on reset circuit and a voltage source for an IC.

A power-on reset circuit according to an aspect of the present invention is a power-on reset circuit integrated with a semiconductor chip, and includes a first resistor having one end connected to a power source node; a first capacitor connected to another end of the first resistor; a second resistor having one end connected to the power source node; a second capacitor connected to another end of the second resistor; a first inverter having a power source terminal connected to the other end of the first resistor, an input terminal connected to the other end of the second resistor, and an output terminal; and a second inverter having a power source terminal connected to the other end of the first resistor, an input terminal connected to the output terminal of the first inverter, and an output terminal electrically connected to a reset signal output terminal.

The power-on reset circuit according to this configuration includes two inverters, namely the first inverter and the second inverter, that are active elements.

According to the power-on reset circuit configured as described above, by supplying a voltage to the power source node from a voltage source for an IC or the like, the same voltage source can be used as a voltage source for the power-on reset circuit and a voltage source for the IC or the like.

According to the power-on reset circuit configured as described above, a voltage is supplied from the power source node to the power source terminal of the first inverter and the power source terminal of the second inverter via the first resistor and the first capacitor. The first resistor and the first capacitor configure an auxiliary voltage source for supplying a voltage to the power source terminal of the first inverter and the power source terminal of the second inverter.

Accordingly, even if the voltage of the voltage source, or in other words, the voltage of the power source node drops, a voltage is supplied to the power source terminal of the first inverter and the power source terminal of the second inverter for a short amount of time by the auxiliary voltage source. The power-on reset circuit operates in a stable manner as a result.

According to the present invention, a power-on reset circuit can operate in a stable manner even in the case where the same voltage source is used as a voltage source for the power-on reset circuit and a voltage source for an IC.

Other features, elements, characteristics and advantages of the present invention will become more apparent from the following detailed description of preferred embodiments of the present invention (with reference to the attached drawings).

DETAILED DESCRIPTION OF THE INVENTION

Figure 1:
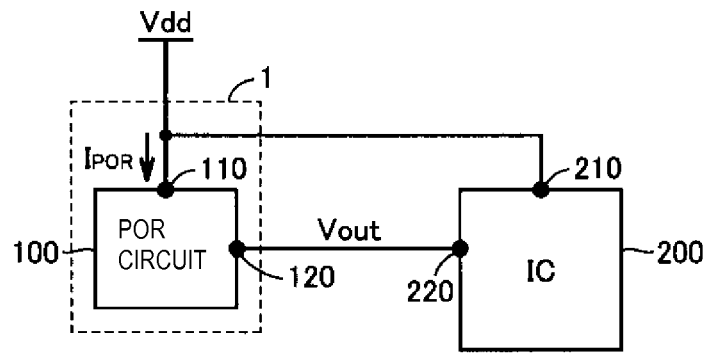
FIG. 1 is a diagram illustrating an example of the application of a power-on reset (POR) circuit according to an embodiment of the present invention.

Hereinafter, the embodiments of the present invention will be described in detail with reference to the drawings. Note that identical or corresponding elements will be given the same reference numerals and the descriptions thereof will not be repeated.

FIG. 1 is a diagram illustrating an example of the application of a power-on reset (POR) circuit according to an embodiment of the present invention.

As shown in FIG. 1, a POR circuit 100 is used to supply a reset signal Vout to an IC 200. The POR circuit 100 is integrated into a semiconductor chip 1. Preferably, the POR circuit 100 is integrated into an SOI (silicon on insulator) chip. The IC 200 is an integrated circuit including a digital circuit and is used in a variety of applications.

As shown in FIG. 1, the POR circuit 100 includes a power source input terminal 110 and a reset signal output terminal 120. The power source input terminal 110 receives a voltage and a current (the operating current $I_{POR}$) required for the operation of the POR circuit 100. The reset signal output terminal 120 outputs the reset signal Vout. The POR circuit 100 controls a voltage of the reset signal Vout to a suitable level, namely high-level or low-level, for example. Low-level refers to a voltage at or near approximately 0 V, for example. High-level refers to a voltage that is higher than low-level. High-level and low-level may be varied to an extent that the two can be detected by the POR circuit 100 and the IC 200.

The IC 200 includes a power source input terminal 210 and a reset input terminal 220. A voltage and a current required for the operation of the IC 200 are supplied to the power source input terminal 210. The reset input terminal 220 receives the reset signal Vout. For example, the IC 200 remains operating in the case where the voltage of the reset signal Vout is a voltage of high-level. On the other hand, the IC 200 enters a reset state in the case where the voltage of the reset signal Vout remains a voltage of low-level for greater than or equal to a predetermined amount of time required to reset the IC 200. When the IC 200 is reset, for example, a flip-flop circuit and the like (not shown) provided in the IC 200 are reset as well.

In FIG. 1, the voltage supplied to the power source input terminal 110 of the POR circuit 100 and the voltage supplied to the power source input terminal 210 of the IC 200 are both a power source voltage Vdd. In other words, the same voltage source is used as the voltage source for the POR circuit 100 and the voltage source for the IC 200. The power source voltage Vdd is set to a voltage level that enables the IC 200 to operate properly.

The POR circuit 100 operates under the power source voltage Vdd and the operating current (consumption current) $I_{POR}$.

When the power source voltage Vdd is at a proper level and the IC 200 is operating normally, the POR circuit 100 sets the reset signal Vout to high-level. The IC 200 stays operating as a result. Whether or not the power source voltage Vdd is at a proper level is determined, for example, based on a threshold $V_{POR}$ for the power source voltage Vdd. The threshold $V_{POR}$ is determined in reference to design data, experiment data, and so on for the IC 200, for example.

The IC 200 will no longer operate normally when the power source voltage Vdd drops below the threshold $V_{POR}$. The POR circuit 100 sets the reset signal Vout to low-level when the power source voltage Vdd drops below the threshold $V_{POR}$. The IC 200 enters the reset state as a result.

The POR circuit 100 will be described in detail with reference to FIG. 2 on.

Figure 2:
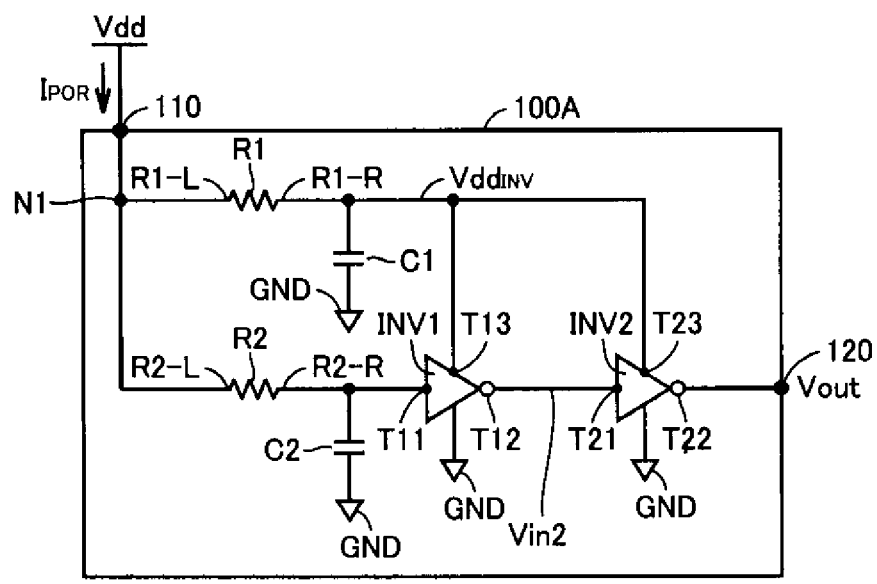
FIG. 2 is a diagram illustrating the configuration of a POR circuit.

FIG. 2 is a diagram illustrating the configuration of a POR circuit 100A according to an embodiment of the present invention.

As shown in FIG. 2, the POR circuit 100A includes the power source input terminal 110, the reset signal output terminal 120, a power source node N1, resistors R1 and R2, capacitors C1 and C2, and inverters INV1 and INV2.

The power source voltage Vdd is supplied to the power source node N1. As described earlier with reference to FIG. 1, the power source voltage Vdd is also supplied to an IC (not shown in FIG. 2) that receives a reset signal from the POR circuit 100A.

The resistor R1 has one end (R1-L) connected to the power source node N1. The capacitor C1 has one end connected to another end (R1-R) of the resistor R1. Another end of the capacitor C1 is connected to a ground GND. The ground GND provides a reference voltage (approximately 0 V, for example). The resistor R2 has one end (R2-L) connected to the power source node N1. One end of the capacitor C2 is connected to another end (R2-R) of the resistor R2. Another end of the capacitor C2 is connected to the ground GND.

The inverter INV1 has an input terminal T11, an output terminal T12, and a power source terminal T13. The input terminal T11 is connected to the other end (R2-R) of the resistor R2. The output terminal T12 is connected to an input terminal T21 of the inverter INV2. The power source terminal T13 is connected to the other end (R1-R) of the resistor R1.

The inverter INV2 has the input terminal T21, an output terminal T22, and a power source terminal T23. The input terminal T21 is connected to the output terminal T12 of the inverter INV1. The output terminal T22 is electrically connected to the reset signal output terminal 120. A passive element such as a resistor and an active element such as a transistor may be provided between the output terminal T22 and the reset signal output terminal 120. The power source terminal T23 is connected to the other end (R1-R) of the resistor R1.

Operations

Operations of the POR circuit 100A shown in FIG. 2 will be described next.

The power source voltage Vdd is supplied as a voltage $Vdd_{INV}$ to the power source terminal T13 of the inverter INV1 and the power source terminal T23 of the inverter INV2 via the resistor R1. The inverters INV1 and INV2 receive the voltage $Vdd_{INV}$ and operate under the voltage $Vdd_{INV}$.

The power source voltage Vdd is supplied to the input terminal T11 of the inverter INV1 via the resistor R2. The inverter INV1 inverts the power source voltage Vdd supplied to the input terminal T11 and outputs the inverted voltage to the output terminal T12.

Specifically, in the case where the power source voltage Vdd is greater than or equal to the threshold $V_{POR}$, the inverter INV1 outputs a low-level voltage to the output terminal T12. In other words, a power source voltage Vdd greater than or equal to the threshold $V_{POR}$ is inverted to a low-level voltage. On the other hand, in the case where the power source voltage Vdd is less than the threshold $V_{POR}$, the inverter INV1 outputs a high-level voltage to the output terminal T12. In other words, a power source voltage less than the threshold $V_{POR}$ voltage is inverted to a high-level voltage.

The inverter INV2 is configured to have the same functions as the inverter INV1. The inverter INV2 receives the voltage from the output terminal T12 of the inverter INV1 at the input terminal T21. The inverter INV2 inverts the voltage at the input terminal T21 and outputs the inverted voltage to the output terminal T22. For example, in the case where the voltage at the input terminal T21 is low-level, the voltage at the output terminal T22 is high-level. Conversely, in the case where the voltage at the input terminal T21 is high-level, the voltage at the output terminal T22 is low-level.

Through this, in the case where the power source voltage Vdd is greater than or equal to the threshold $V_{POR}$, the inverter INV2 outputs a high-level voltage to the output terminal T22. On the other hand, in the case where the power source voltage Vdd is less than the threshold $V_{POR}$, the inverter INV2 outputs a low-level voltage to the output terminal T22.

The reset signal output terminal 120 receives the voltage from the output terminal T22 of the inverter INV2 and is set to that voltage.

The resistor R1 and the capacitor C1 configure an auxiliary power source for supplying a voltage $Vdd_{INV}$ to the power source terminals T13 and T23 of the inverters INV1 and INV2, respectively.

In a steady state, the voltage $Vdd_{INV}$ is a constant voltage equal to the power source voltage Vdd. When the device leaves the steady state and the power source voltage Vdd drops (to approximately 0 V, for example), the voltage $Vdd_{INV}$ gradually drops to 0 V as well. The time required for the voltage $Vdd_{INV}$ to drop in this manner is dependent on a time constant τ1 determined by the resistor R1 and the capacitor C1. Due to this time constant τ1 (where τ1 is not 0), the voltage $Vdd_{INV}$ is supplied to the power source terminal T13 of the inverter INV1 and the power source terminal T23 of the inverter INV2 at a certain level for a set period even if the power source voltage Vdd is lost. The inverters INV1 and INV2 can operate normally during this set period.

Meanwhile, when the power source voltage Vdd drops, the voltage supplied to the input terminal T11 of the inverter INV1 will also drop gradually to approximately 0 V. The time required for the voltage Vdd to drop in this manner is dependent on a time constant τ2 determined by the resistor R2 and the capacitor C2. Due to this time constant τ2, the voltage supplied to the input terminal T11 of the inverter INV1 will not immediately drop below the threshold $V_{POR}$ even if the power source voltage Vdd is lost.

In other words, there is time lag from when the power source voltage Vdd is lost to when the voltage supplied to the input terminal T11 of the inverter INV1 drops below the threshold $V_{POR}$. It is necessary for the inverters INV1 and INV2 to receive a proper voltage from the power source terminals T13 and T23 and operate normally during this period of time lag.

The time constant τ1 determined by the resistor R1 and the capacitor C1 is set to be greater than the time constant τ2 determined by the resistor R2 and the capacitor C2. As a result, the voltage $Vdd_{INV}$ is at a level at which the inverters INV1 and INV2 can operate normally for certain amount of time (a short time) after the voltage supplied to the input terminal T11 of the inverter INV1 has dropped below the threshold $V_{POR}$. Accordingly, the POR circuit 100A operates normally even in the case where the power source voltage Vdd has dropped.

According to the configuration shown in FIG. 2, the POR circuit can operate in a stable manner even in the case where the same voltage source is used as the voltage source for the POR circuit and the voltage source for an IC or the like.

Variation

Figure 3:
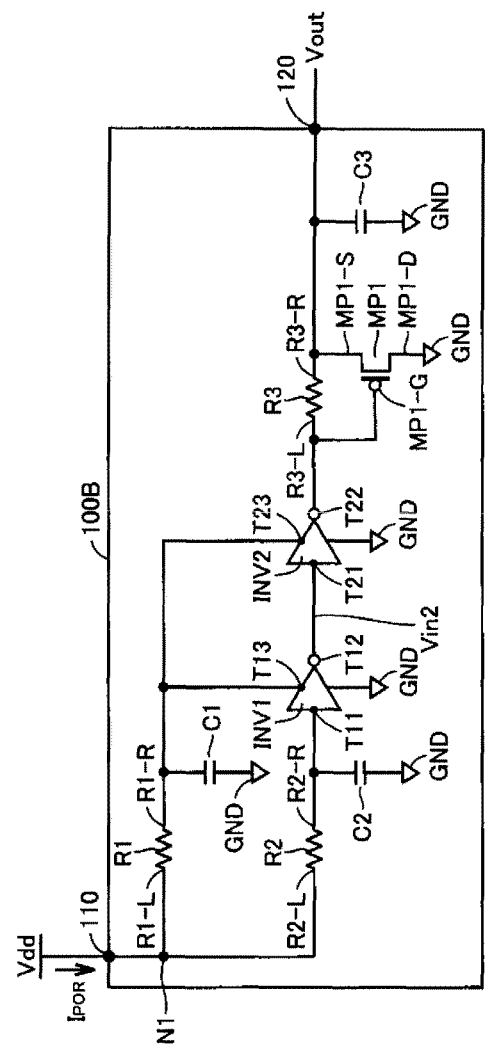
FIG. 3 is a diagram illustrating a variation on the POR circuit.

FIG. 3 is a diagram illustrating the configuration of a POR circuit 100B serving as a variation on the POR circuit 100A shown in FIG. 2.

Compared to the POR circuit 100A shown in FIG. 2, the POR circuit 100B further includes a resistor R3, a capacitor C3, and a transistor MP1.

One end (R3-L) of the resistor R3 is connected to the output terminal T22 of the inverter INV2. Another end (R3-R) of the resistor R3 is connected to the reset signal output terminal 120. One end of the capacitor C3 is connected to the other end (R3-R) of the resistor R3. Another end of the capacitor C3 is connected to the ground GND. The transistor MP1 is connected to the capacitor C3 and discharges the capacitor C3. A gate end MP1-G of the transistor MP1 is connected to the output terminal T22 of the inverter INV2. The gate end MP1-G serves as a control terminal of the transistor MP1.

In the POR circuit 100B, the resistor R3 and the capacitor C3 are provided between the output terminal T22 of the inverter INV2 and the reset signal output terminal 120. Accordingly, a delay time arises, in which the voltage at the reset signal output terminal 120 follows the voltage at the output terminal T22 after a delay. The delay time is dependent on a time constant τ3 determined by the resistor R3 and the capacitor C3. The delay time between the voltage at the output terminal T22 and the voltage at the reset signal output terminal 120 can be adjusted by changing the design values of the resistor R3 and the capacitor C3.

The transistor MP1 is a P-type FET (field effect transistor), for example. The transistor MP1 has the gate end MP1-G, which serves as a control terminal, a source end MP1-S, and a drain end MP1-D. The gate end MP1-G is connected to the output terminal T22 of the inverter INV2, and thus the voltage at the gate end MP1-G is low-level when the voltage at the output terminal T22 is low-level. The transistor MP1 is designed so that the source end MP1-S and the drain end MP1-D are conductive when the voltage at the gate end MP1-G is low-level.

The source end MP1-S is connected to the other end (R3-R) of the resistor R3. The drain end MP1-D is connected to the ground GND. Accordingly, when the voltage at the output terminal T22 of the inverter INV2 is low-level, the source end MP1-S and the drain end MP1-D are conductive, and a charge accumulated in the capacitor C3 is discharged to the ground GND via the transistor MP1. Through this, the capacitor C3 can be discharged in a short amount of time. Accordingly, the voltage at the reset signal output terminal 120 can switch from high-level to low-level in a short amount of time immediately when the voltage at the output terminal T22 is switched from high-level to low-level.

According to the configuration of the POR circuit 100B, the delay time between the voltage at the output terminal T22 and the voltage at the reset signal output terminal 120 can be adjusted in the case where the voltage at the output terminal T22 switches from low-level to high-level. Furthermore, because the voltage at the reset signal output terminal 120 switches from high-level to low-level in a comparatively short amount of time, the responsiveness of the POR circuit 100B is improved.

POR Circuit Parameters

Figure 4:
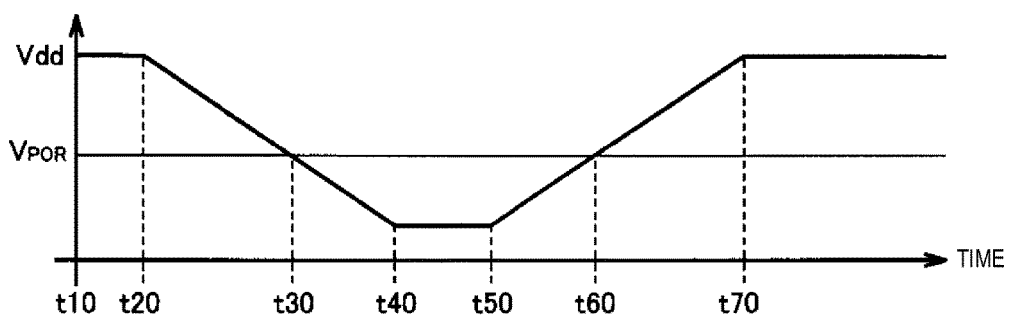
FIG. 4 is a diagram illustrating an example of parameters for a POR circuit.
Figure 5:
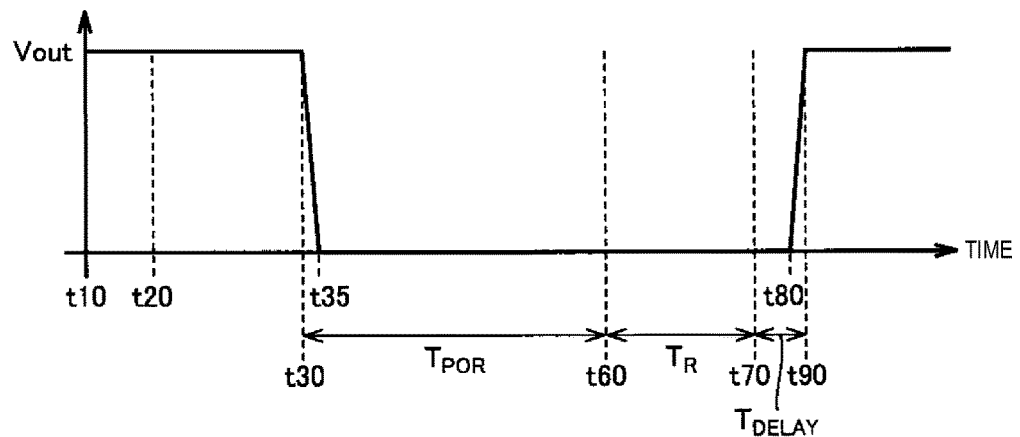
FIG. 5 is a diagram illustrating an example of parameters for a POR circuit.

Next, several parameters indicating the capabilities of a POR circuit will be described. FIGS. 4 and 5 are diagrams illustrating an example of parameters for a POR circuit.

FIG. 4 is a graph illustrating an example of changes in the power source voltage Vdd indicated in FIG. 1 and the like. In FIG. 4, the horizontal axis represents time and the vertical axis represents the power source voltage Vdd.

As shown in FIG. 4, the power source voltage Vdd is constant at time t10. At this time, the power source voltage Vdd is a voltage at which the IC (the IC 200 in FIG. 1 or the like) operates normally.

The power source voltage Vdd begins to drop (fall) at time t20.

The power source voltage Vdd drops below the threshold $V_{POR}$ at time t30.

The power source voltage Vdd stops dropping and becomes constant at time t40.

The power source voltage Vdd begins to rise (return) at time t50.

The power source voltage Vdd becomes greater than or equal to the threshold $V_{POR}$ at time t60.

The power source voltage Vdd stops rising and becomes constant at time t70. The power source voltage Vdd thus makes a complete return to the state found at time t20 and earlier.

FIG. 5 is a graph illustrating an example of the operations of the POR circuit operating under the power source voltage Vdd. In FIG. 5, the horizontal axis represents time and the vertical axis represents the reset signal Vout outputted by the POR circuit.

As shown in FIGS. 4 and 5, the reset signal Vout is constant at time t10. At this time, the reset signal Vout is high-level, and the IC is not in a reset state (a reset release state).

The power source voltage Vdd drops below the threshold $V_{POR}$ at time t30, and the reset signal Vout begins to drop.

The reset signal Vout goes to low-level at time t35. The IC enters the reset state as a result. In other words, the IC is reset and put into a stopped state.

The reset signal Vout is at low-level regardless of the power source voltage Vdd during a period from time t30 to time t60 (a delay time $T_{POR}$). The delay time $T_{POR}$ stabilizes the operation of the POR circuit. For example, the power source voltage Vdd drops below the threshold $V_{POR}$ at time t30. The reset signal Vout is kept at low-level in a stable manner even in the case where the power source voltage Vdd is greater than or equal to the threshold $V_{POR}$ for only a short amount of time immediately thereafter.

Furthermore, the reset signal Vout is kept at low-level during a period from time t60 to time t70 (a delay time $T_R$). The delay time $T_R$ stabilizes the operation of the POR circuit.

The reset signal Vout is kept at low-level during a period from time t70 to time t90 (a delay time $T_{DELAY}$). In other words, after the power source voltage Vdd has returned completely at time t70, the reset signal Vout begins to rise at time t80 and reaches high-level at time t90. The delay time $T_{DELAY}$ stabilizes the operation of the POR circuit. In other words, due to the delay time $T_{DELAY}$, the reset signal Vout is set to low-level for a period sufficient to reset the IC (the predetermined amount of time required to reset the IC 200 described earlier with reference to FIG. 1).

The delay time $T_{POR}$, the delay time $T_R$, the delay time $T_{DELAY}$, and so on shown in FIGS. 4 and 5 are parameters indicating the capabilities of the POR circuit. The operating current $I_{POR}$ shown in FIG. 3 is also a parameter indicating the capabilities of the POR circuit. Furthermore, the power source voltage Vdd and the threshold $V_{POR}$ shown in FIG. 4 and so on are parameters indicating the capabilities of the POR circuit.

Effects of POR Circuit Constituent Elements

Next, an example of the effects provided by the constituent elements of the POR circuit 100B shown in FIG. 3 will be described.

Effects of R1 and C1

Figure 6:
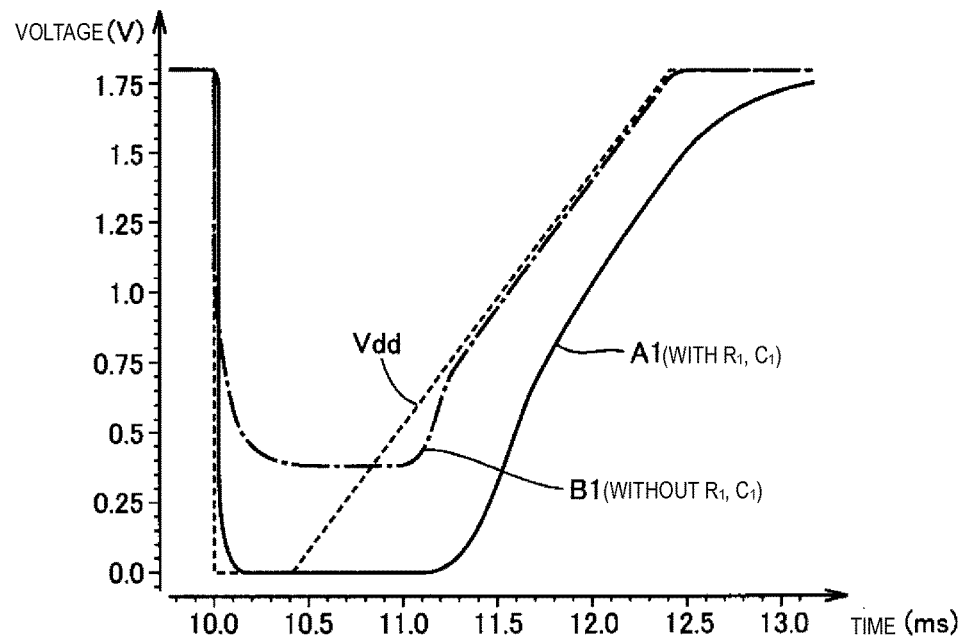
FIG. 6 is a diagram illustrating an effect of a resistor R1 and a capacitor C1.
Figure 7:
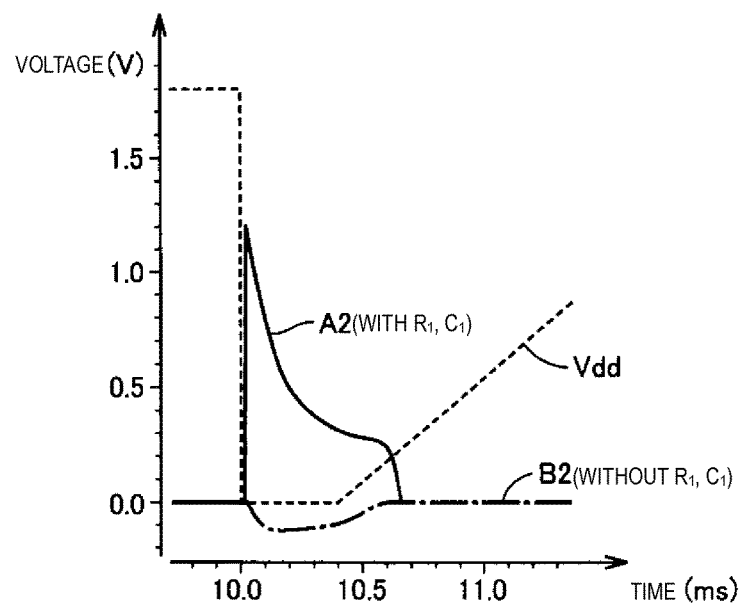
FIG. 7 is a diagram illustrating an effect of a resistor R1 and a capacitor C1.
Figure 8:
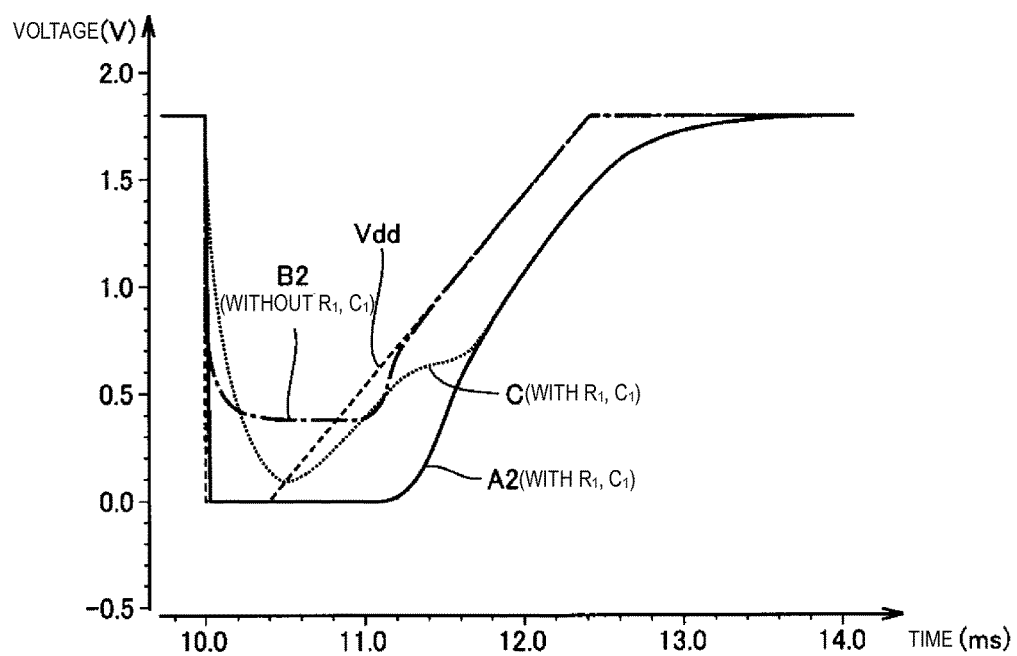
FIG. 8 is a diagram illustrating an effect of a resistor R1 and a capacitor C1.

FIGS. 6 to 8 are diagrams illustrating the effects of the resistor R1 and the capacitor C1 shown in FIG. 3.

FIG. 6 is a graph illustrating a result of simulating the reset signal Vout relative to the changes in the power source voltage Vdd in the POR circuit 100B shown in FIG. 3. In the graph, the horizontal axis represents time (ms) and the vertical axis represents voltage (V). Numerical values resulting from the simulation are also provided on the horizontal axis and the vertical axis for reference. Note that in this graph, the power source voltage Vdd drops comparatively sharply, and then rises comparatively gradually.

A line A1 shown in FIG. 6 indicates the reset signal Vout of the POR circuit 100B shown in FIG. 3, or in other words, a POR circuit that has the resistor R1 and the capacitor C1. A line B1 indicates the reset signal Vout of a POR circuit that does not have the resistor R1 and the capacitor C1, as a comparative example. In the POR circuit that does not have the resistor R1 and the capacitor C1, the power source voltage Vdd and is directly connected to the power source terminals T13 and T23 as shown in FIG. 3, for example. Note that in the simulation shown in FIG. 6, the POR circuit includes the resistors R2 and R3 and the capacitors C2 and C3 shown in FIG. 3. The same applies to FIGS. 7 and 8.

As shown in FIG. 6, the line A1 and the line B1 indicate high-level in the case where the power source voltage Vdd is comparatively high. The power source voltage Vdd being "comparatively high" refers to the power source voltage Vdd being greater than or equal to the threshold $V_{POR}$ (not shown in FIG. 6).

When the power source voltage Vdd drops, the voltages indicated by the line A1 and the line B1 both drop. At this time, in the POR circuit that has the resistor R1 and the capacitor C1, the voltage of the reset signal Vout drops to a low voltage (near approximately 0 V), as indicated by the line A1. This indicates that the inverters INV1 and INV2 are operating normally. On the other hand, in the POR circuit that does not have the resistor R1 and the capacitor C1, the voltage of the reset signal Vout does not drop to near approximately 0 V, as indicated by the line B1. This indicates that the inverters INV1 and INV2 are not operating normally. With respect to the line B1, the reason the inverters INV1 and INV2 do not operate normally is that when the power source voltage Vdd drops, the supply of voltage to the power source terminals T13 and T23 of the inverters INV1 and INV2 is lost.

In other words, providing the resistor R1 and the capacitor C1 ensures that the inverters INV1 and INV2 operate normally and the reset signal Vout is set to a sufficiently low voltage even in the case where the power source voltage Vdd has dropped.

Appropriately designing the resistor R1 and the capacitor C1 makes it possible to adjust the timing at which the reset signal Vout is to be set to low-level, namely the delay time $T_{POR}$ (see FIG. 5), which serves as a parameter indicating the capabilities of the POR circuit.

FIG. 7 is a graph indicating a result of simulating an input voltage Vin2 at the inverter INV2 in the POR circuit 100B shown in FIG. 3, in the case where the power source voltage Vdd changes in the same manner as shown in FIG. 6.

A line A2 shown in FIG. 7 indicates the input voltage Vin2 at the inverter INV2 of the POR circuit 100B shown in FIG. 3. A line B2 indicates the input voltage Vin2 at the inverter INV2 of a POR circuit that does not have the resistor R1 and the capacitor C1, as a comparative example.

As shown in FIG. 7, when the power source voltage Vdd drops, the input voltage Vin2 rises and then gradually drops thereafter in the POR circuit that has the resistor R1 and the capacitor C1, as indicated by the line A2. In other words, there is a period of time for which Vin2 is high-level. This indicates that the inverter INV1 operates normally and outputs a voltage in which the power source voltage Vdd is inverted during that period of time. However, in the POR circuit that does not have the resistor R1 and the capacitor C1, the input voltage Vin2 does not rise, and takes on a negative voltage, for example, as indicated by the line B2. This indicates that the inverter INV1 is not operating normally.

In other words, the resistor R1 and the capacitor C1 enable the inverter INV1 to operate normally even in the case where the power source voltage Vdd has dropped. The same applies to the inverter INV2.

FIG. 8 is a graph illustrating a result of simulating a voltage $Vdd_{INV}$ supplied to the power source terminals T13 and T23 of the inverters INV1 and INV2 in the POR circuit 100B shown in FIG. 3 in the case where the power source voltage Vdd changes in the same manner as shown in FIG. 6.

The line A2 and the line B2 shown in FIG. 8 correspond to the line A2 and the line B2 shown in FIG. 6. In other words, the line A2 indicates the reset signal Vout of a POR circuit that has the resistor R1 and the capacitor C1, and the line B2 indicates the reset signal Vout of a POR circuit that does not have the resistor R1 and the capacitor C1. A line C indicates the voltage $Vdd_{INV}$ of the POR circuit 100B shown in FIG. 3, or in other words, a POR circuit that has the resistor R1 and the capacitor C1.

As shown in FIG. 8, when the power source voltage Vdd drops, the $Vdd_{INV}$ drops in a delayed manner after the drop of the power source voltage Vdd, as indicated by the line C. Accordingly, even if the power source voltage Vdd drops, the voltage $Vdd_{INV}$ will have a voltage of a certain level greater than approximately 0 for a set period of time. Accordingly, a voltage is supplied to the power source terminals T13 and T23 of the inverters INV1 and INV2 and the inverters INV1 and INV2 operate normally.

In other words, the resistor R1 and the capacitor C1 enable the inverters INV1 and INV2 to operate normally even in the case where the power source voltage Vdd has dropped.

Effects of the resistor R1 and the capacitor C1 have been described thus far with reference to FIGS. 6 to 8. These effects can also be obtained in the POR circuit 100A shown in FIG. 2.

Effects of R2 and C2

Figure 9:
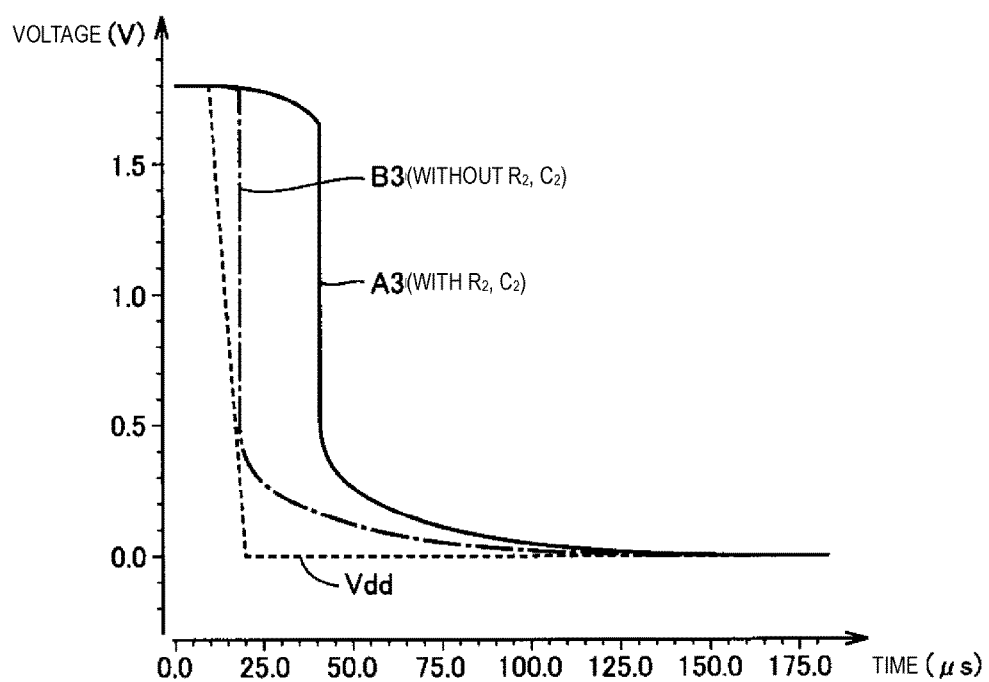
FIG. 9 is a diagram illustrating an effect of a resistor R2 and a capacitor C2.

FIG. 9 is a diagram illustrating the effects of the resistor R2 and the capacitor C2 shown in FIG. 3. FIG. 9 is a graph illustrating a result of simulating the reset signal Vout relative to the changes in the power source voltage Vdd in the POR circuit 100B shown in FIG. 3. In the graph, the horizontal axis represents time (μs) and the vertical axis represents voltage (V). In this graph, the power source voltage Vdd drops comparatively sharply. Note that in the simulation shown in FIG. 9, the POR circuit includes the resistor R2 and the capacitor C2 shown in FIG. 3.

A line A3 shown in FIG. 9 indicates the reset signal Vout of the POR circuit 100B shown in FIG. 3, or in other words, a POR circuit that has the resistor R2 and the capacitor C2. A line B3 indicates the reset signal Vout of a POR circuit that does not have the resistor R2 and the capacitor C2, as a comparative example. The POR circuit that does not have the resistor R2 and the capacitor C2 is configured with the power source voltage Vdd and the input terminal T11 shown in FIG. 3 connected directly, for example.

It should be noted that the time axis (μs) in the graph shown in FIG. 9 and the time axes (ms) in the graphs shown in FIGS. 6 to 8 have different ranges. In other words, the time axis in the graph shown in FIG. 9 is enlarged compared to the graphs in FIGS. 6 to 8.

As shown in FIG. 9, in the case where the power source voltage Vdd is comparatively high, the voltage of the reset signal Vout is also high-level, as indicated by the line A3 and the line B3.

When the power source voltage Vdd drops, the voltages of the reset signal Vout indicated by the line A3 and the line B3 both drop. At this time, in the POR circuit that does not have the resistor R2 and the capacitor C2, the voltage of the reset signal Vout drops with almost no delay from the drop in the power source voltage Vdd, as indicated by the line B3. However, in the circuit that has the resistor R2 and the capacitor C2, the voltage of the reset signal Vout drops in a delayed manner after the drop in the power source voltage Vdd, as indicated by the line A3.

The following problem can occur when the reset signal Vout drops with almost no delay from the drop in the power source voltage Vdd as indicated by the line B3. In the case where the power source voltage Vdd drops and stops momentarily (a momentary power failure), the voltage of the reset signal Vout also drops. The IC can be reset as a result. There are cases where an IC is designed to operate without any problems when there is a momentary power failure. When the POR circuit supplies such a low-level reset signal Vout in response to a momentary power failure, the IC will be reset. Such POR circuit operations are resultingly erroneous operations.

However, if the reset signal Vout drops after a set amount of delay from the drop in the power source voltage Vdd, as indicated by the line A3, such erroneous operations caused by momentary power failure are suppressed.

The momentary power failure time for the power source voltage Vdd can be thought of in a variety of ways. For example, the POR circuit is designed so that erroneous operations do not occur when the momentary power failure time is approximately 10 μs. In this case, the POR circuit is designed so that the reset signal Vout has a delay time of greater than or equal to approximately 10 μs from the drop in the power source voltage Vdd. The delay time of greater than or equal to approximately 10 μs is realized by appropriately setting the time constant τ2 determined by the resistor R2 and the capacitor C2 shown in FIG. 3. Specific design values for the resistor R2 and the capacitor C2 will be described later.

In other words, the resistor R2 and the capacitor C2 make it possible to suppress the occurrence of erroneous operations that erroneously reset the IC, even in the case where the power source voltage Vdd has experienced a momentary power failure.

Although the foregoing has described the effects of the resistor R2 and the capacitor C2, these effects can also be obtained in the POR circuit 100A shown in FIG. 2.

Effects of R3 and C3

Figure 10:
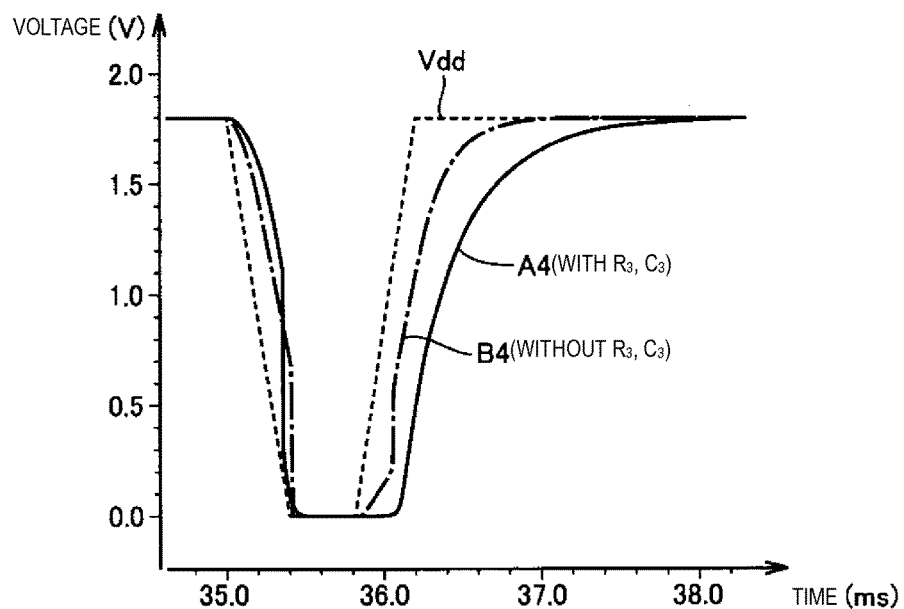
FIG. 10 is a diagram illustrating an effect of a resistor R3 and a capacitor C3.

FIG. 10 is a diagram illustrating the effects of the resistor R3 and the capacitor C3 shown in FIG. 3. FIG. 10 is a graph illustrating a result of simulating the reset signal Vout relative to the changes in the power source voltage Vdd in the POR circuit 100B shown in FIG. 3. In the graph, the horizontal axis represents time (ms) and the vertical axis represents voltage (V). Note that in this graph, power source voltage drops comparatively gradually, and then rises comparatively gradually.

A line A4 shown in FIG. 10 indicates the reset signal Vout of the POR circuit 100B shown in FIG. 3, or in other words, a POR circuit that has the resistor R3 and the capacitor C3. A line B4 indicates the reset signal Vout of a POR circuit that does not have the resistor R3 and the capacitor C3, as a comparative example. The POR circuit that does not have the resistor R3 and the capacitor C3 corresponds to the configuration of the POR circuit 100A shown in FIG. 1, for example.

As shown in FIG. 10, when the power source voltage Vdd rises, the voltages of the reset signal Vout also both rise, as indicated by the line A4 and the line B4. In the POR circuit that does not have the resistor R3 and the capacitor C3, the voltage of the reset signal Vout rises along with the power source voltage Vdd comparatively closely, as indicated by the line B4. However, in the POR circuit that has the resistor R3 and the capacitor C3, the voltage of the reset signal Vout rises with a certain amount of delay after the power source voltage Vdd, as indicated by the line A4.

When the voltage of the reset signal Vout rises along with the power source voltage Vdd closely, as indicated by the line B4, a sufficient time for which the reset signal Vout is low-level is not ensured. There is thus a chance that the IC will not be reset.

However, in the case where the voltage of the reset signal Vout rises with a certain delay time after the power source voltage Vdd, as indicated by the line A4, a sufficient time for which the reset signal Vout is low-level is ensured, and thus the IC can be reset.

In other words, the resistor R3 and the capacitor C3 enable an appropriate delay time to be set relative to the rise of the power source voltage Vdd, which makes it possible to reset the IC.

Appropriately designing the resistor R3 and the capacitor C3 makes it possible to adjust the delay time of the reset signal Vout relative to the rising time of the power source voltage Vdd, namely the delay time $T_{DELAY}$ (see FIG. 5), which serves as a parameter indicating the capabilities of the POR circuit.

Effects of MP1

Figure 11:
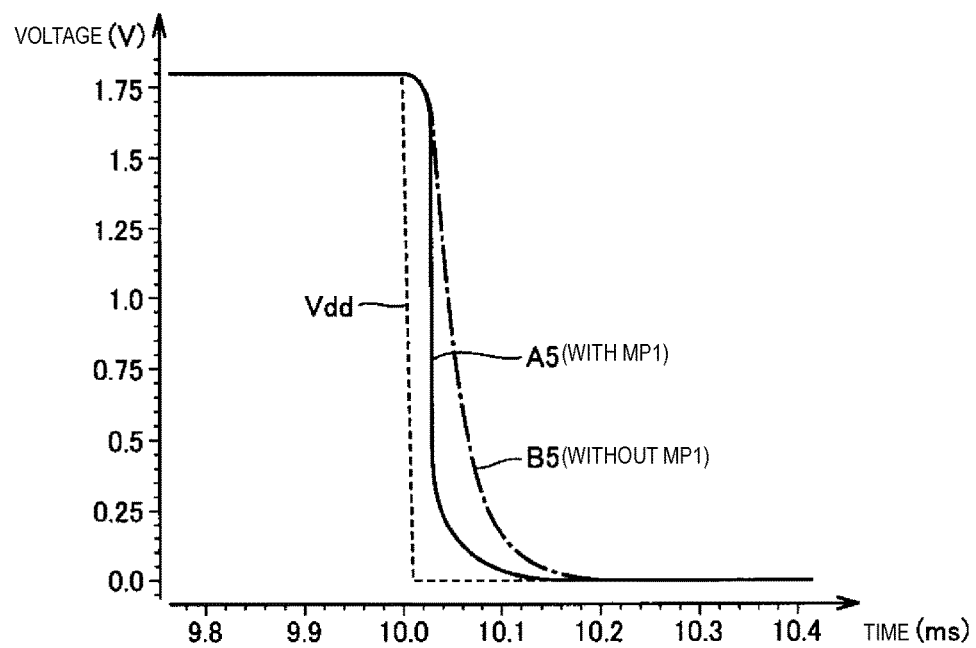
FIG. 11 is a diagram illustrating an effect of a transistor MP1.

FIG. 11 is a diagram illustrating an effect of the transistor MP1 shown in FIG. 3.

FIG. 11 is a graph illustrating a result of simulating the reset signal Vout relative to the changes in the power source voltage Vdd in the POR circuit 100B shown in FIG. 3. In the graph, the horizontal axis represents time (ms) and the vertical axis represents voltage (V). In this graph, the power source voltage drops comparatively sharply.

A line A5 shown in FIG. 11 indicates the reset signal Vout of the POR circuit 100B shown in FIG. 3, or in other words, a POR circuit that has the transistor MP1. A line B5 indicates the reset signal Vout of a POR circuit that does not have the transistor MP1, as a comparative example. The POR circuit that does not have the transistor MP1 has the configuration shown in FIG. 3 with the exception of the transistor MP1, for example.

As shown in FIG. 11, when the power source voltage Vdd drops, the voltage of the reset signal Vout also drops regardless of whether or not the transistor MP1 is present. Here, in the POR circuit that does not have the transistor MP1, the voltage of the reset signal Vout drops after a significant delay from the power source voltage Vdd, as indicated by the line B5. On the other hand, in the POR circuit that has the transistor MP1, the voltage of the reset signal Vout drops closely with the drop in the power source voltage Vdd, as indicated by the line A5. This is because the charge accumulated in the capacitor C3 is discharged in a short amount of time by the transistor MP1.

In other words, the transistor MP1 makes it possible for the reset signal Vout to closely follow the fall of the power source voltage Vdd.

The amount of time for which the reset signal Vout is low-level during the delay time $T_{POR}$, for example, is adjusted by controlling the fall of the reset signal Vout using the transistor MP1.

Design Values

Referring once again to FIG. 3, the POR circuit 100B is formed so as to be integrated with a semiconductor chip. In other words, the elements included in the POR circuit 100B, such as the resistors R1 to R3, the capacitors C1 to C3, and so on, are also formed in the semiconductor chip.

As described earlier, the resistor R2 and the capacitor C2 provide the time constant $\tau 2$. For example, consider a case where the time constant $\tau 2$ is set so that the reset signal Vout has a delay time greater than or equal to approximately 10 μs following the drop of the power source voltage Vdd. In this case, it is preferable to set the time constant $\tau 2$ to a value that is greater than approximately 10 μs. An appropriate time constant $\tau 2$ of greater than or equal to approximately 10 μs can be obtained by, for example, designing the resistor R2 to approximately 16.6 MΩ and the capacitor C2 to approximately 0.66 pF.

Furthermore, as described earlier, the resistor R1 and the capacitor C1 provide the time constant $\tau 1$. The time constant $\tau 1$ is set to be greater than the time constant $\tau 2$ determined by the resistor R2 and the capacitor C2. A time constant $\tau 1$ greater than the time constant $\tau 2$ can be obtained by, for example, designing the resistor R1 to approximately 66 MΩ and the capacitor C1 to approximately 2.4 pF.

In the above example, the resistors R1 and R2 are designed having high resistance values, to the order of MΩ, whereas the capacitors C1 and C2 are designed having low capacity values, to the order of pF. This provides advantages such as those described below.

When a capacitor having a large capacity value is formed in a semiconductor chip, the capacitor will take up a large amount of surface area on the semiconductor chip. However, if parameters such as materials and the like are selected appropriately, a resistor having a high resistance value can be formed in the semiconductor chip without the resistor taking up a large amount of surface area on the semiconductor chip. Accordingly, in the case where a predetermined time constant is to be realized using a resistor and a capacitor, the surface area of the semiconductor chip is reduced by increasing the resistance value and decreasing the capacity value.

The same applies to the resistor R3 and the capacitor C3; namely, it is preferable to increase the resistance value of the resistor R3 (to the MΩ order, for example) and reduce the capacity value of the capacitor C3 (to the pF order, for example).

Inverter Configuration

Figure 12:
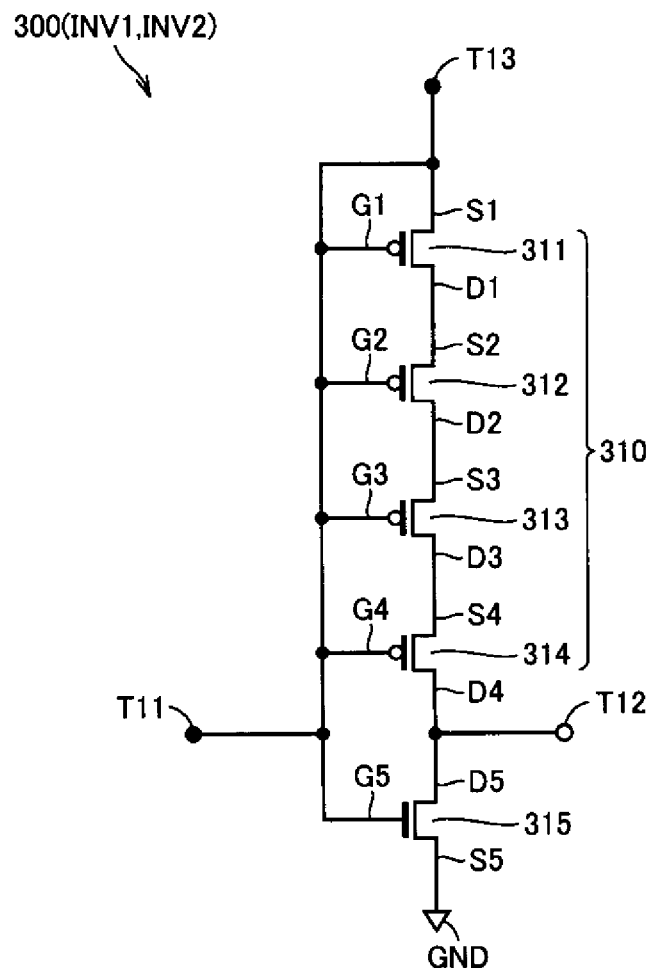
FIG. 12 is a diagram illustrating an example of the configuration of an inverter.

FIG. 12 is a diagram illustrating an example of the configuration of the inverter INV1 and/or INV2 shown in FIG. 2 and the like. In other words, the configuration shown in FIG. 12 may be applied only to one of the inverters INV1 and INV2 shown in FIG. 2 and the like, or may be applied to both the inverters INV1 and INV2.

As shown in FIG. 12, an inverter 300 (corresponding to the inverter INV1 and/or INV2 shown in FIG. 2) includes the input terminal T11, the output terminal T12, the power source terminal T13, and transistors 311 to 315.

The input terminal T11, the output terminal T12, and the power source terminal T13 may be understood as corresponding to the input terminal T11, the output terminal T12, and the power source terminal T13 of the inverter INV1 shown in FIG. 2, for example.

The transistors 311 to 315 are MOS (metal oxide semiconductor) FETs, and configure an inverter circuit. The transistors 311 to 314 are all P-type MOSFETs. The transistors 311 to 314 are cascode-connected, collectively forming a single transistor 310 (P-type MOSFET). The transistor 315 is an N-type MOSFET. The inverter 300 is a logic circuit configured by connecting the transistor 310, which is a P-type MOSFET, and the transistor 315, which is an N-type MOSFET.

The power source terminal T13 is electrically connected to a source end S1 of the transistor 311.

A drain end D1 of the transistor 311 is electrically connected to a source end S2 of the transistor 312. A drain end D2 of the transistor 312 is electrically connected to a source end S3 of the transistor 313. A drain end D3 of the transistor 313 is electrically connected to a source end S4 of the transistor 314. A drain end D4 of the transistor 314 is electrically connected to a drain end D5 of the transistor 315. A source end S5 of the transistor 315 is electrically connected to the ground GND.

The input terminal T11 is electrically connected to gate ends G1 to G5 of the transistors 311 to 315, respectively.

The output terminal T12 is electrically connected to the drain end D4 of the transistor 314 and the drain end D5 of the transistor 315.

The electrical characteristics of the transistor 310, which is a P-type MOSFET, vary depending on a ratio between a channel length L and a channel width W (W/L). In the case where the channel width W is the same, the driving performance of the transistor 310 will decrease if (W/L) drops. Conversely, the driving performance of the transistor 310 will increase if (W/L) rises. The same applies to the transistor 315, which is an N-type MOSFET.

In the inverter 300, the transistors 311 to 315 are designed so that (W/L) is the same magnitude for each transistor. Accordingly, the transistors 311 to 315 can be manufactured within the same semiconductor chip using the same semiconductor process (for example, a set process where (W/L) =($W_0/L_0$)).

It is generally known that in the case where (W/L) of the transistors 311 to 314 and (W/L) of the transistor 315 are both the same magnitude at ($W_0/L_0$), the driving performance of the transistors 311 to 314, which are P-type MOSFETs, will be lower than the driving performance of the transistor 315, which is an N-type MOSFET.

Accordingly, in light of the difference in the driving performance of P-type MOSFETs and the driving performance of N-type MOSFETs, focus was placed on the ability to adjust the driving performance by cascode-connecting P-type MOSFETs. That is, the transistor 310 is configured of the transistors 311 to 314 being cascode-connected, and thus the transistor 310 has a different driving performance than the driving performance of each of the transistors 311 to 314.

The driving performance of the transistor 310 configured of the transistors 311 to 314 is adjusted by using a plurality of transistors 311 to 314 in this manner. The number of transistors that configure the transistor 310 is not limited to four, that is, the transistors 311 to 314. The driving performance of the transistor 310, which is a P-type MOSFET, is designed as appropriate by appropriately selecting the number of transistors that configure the transistor 310. Through this, balance can be struck between the driving performance of the transistor 310, which is a P-type MOSFET, and the driving performance of the transistor 315, which is an N-type MOSFET.

The time in which the voltage at the output terminal T12 of the inverter 300 switches from low-level to high-level (a rise time) is dependent on the driving performance of the transistor 310. Likewise, the time in which the voltage at the output terminal T12 of the inverter 300 switches from high-level to low-level (a fall time) is dependent on the driving performance of the transistor 315.

Accordingly, the rise time and the fall time can be made equal in the inverter 300 by, for example, designing the transistor 310 and the transistor 315 to have almost the same driving performance as each other.

However, the design may be such that the driving performance of the transistor 310 is lower than the driving performance of the transistor 315. Doing so makes the rise time longer than the fall time in the inverter 300. To rephrase, this applies a delay time to the rise in the inverter 300. This delay time provides the same effect as the delay time obtained by using the resistor R3 and the capacitor C3 shown in FIG. 3 (the delay time $T_{DELAY}$ shown in FIG. 5, for example). By adjusting the driving performance of the transistor 310, the resistor R3 and the capacitor C3 can be reduced in size or rendered unnecessary while also realizing the desired delay time $T_{DELAY}$.

The embodiments disclosed herein are to be understood in all ways as exemplary and in no ways limiting. The scope of the present invention is defined not by the aforementioned descriptions of embodiments but by the scope of the appended claims, and is intended to encompasses all changes that fall within the same essential spirit as the scope of the claims.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power-on reset circuit integrated with a semiconductor chip, the power-on reset circuit comprising:
    a first resistor having one end connected to a power source node;
    a first capacitor connected to another end of the first resistor;
    a second resistor having one end connected to the power source node;
    a second capacitor connected to another end of the second resistor;
    a first inverter having a power source terminal connected to the other end of the first resistor, an input terminal connected to the other end of the second resistor, and an output terminal;
    a second inverter having a power source terminal connected to the other end of the first resistor, an input terminal connected to the output terminal of the first inverter, and an output terminal electrically connected to a reset signal output terminal;

a third resistor having one end connected to the output terminal of the second inverter and another end connected to the reset signal output terminal;
a third capacitor connected to the other end of the third resistor; and
a transistor connected to the third capacitor and discharging the third capacitor,
wherein a control terminal of the transistor is connected to the output terminal of the second inverter,
wherein each of the first inverter and the second inverter includes a plurality of cascode-connected P-type FETs and an N-type FET connected to the plurality of P-type FETs, and
wherein the plurality of P-type FETs for the first inverter and the second inverter is selected such that a rise time of the first inverter is almost equal to a fall time of the first inverter, and a rise time of the second inverter is almost equal to a fall time of the second inverter.

2. The power-on reset circuit according to claim 1, wherein a time constant determined by the first resistor and the first capacitor is greater than a time constant determined by the second resistor and the second capacitor.

* * * * *